United States Patent [19]
Fuerhoff

[11] Patent Number: 5,653,799
[45] Date of Patent: Aug. 5, 1997

[54] METHOD FOR CONTROLLING GROWTH OF A SILICON CRYSTAL

[75] Inventor: Robert H. Fuerhoff, St. Charles, Mo.

[73] Assignee: MEMC Electronic Materials, Inc., St. Peters, Mo.

[21] Appl. No.: 459,765

[22] Filed: Jun. 2, 1995

[51] Int. Cl.[6] .................................................. C30B 15/20
[52] U.S. Cl. ................................ 117/14; 117/15; 117/20; 117/201
[58] Field of Search .............................. 117/13, 14, 15, 117/20, 201, 202; 250/559.24

[56] References Cited

U.S. PATENT DOCUMENTS

| | | | |
|---|---|---|---|
| 3,740,563 | 6/1973 | Reichard | 117/15 |
| 4,350,557 | 9/1982 | Scholl et al. | 117/15 |
| 4,710,258 | 12/1987 | Latka | 117/15 |
| 4,926,357 | 5/1990 | Katsuoka et al. | 117/15 |
| 5,138,179 | 8/1992 | Baba et al. | 117/15 |
| 5,170,061 | 12/1992 | Baba | 250/9.24 |
| 5,178,720 | 1/1993 | Frederick et al. | 117/20 |
| 5,183,528 | 2/1993 | Baba et al. | 117/207 |
| 5,240,684 | 8/1993 | Baba et al. | 117/14 |
| 5,288,363 | 2/1994 | Araki | 117/201 |
| 5,378,900 | 1/1995 | Hirano et al. | 117/201 |
| 5,437,242 | 8/1995 | Hofstetter et al. | 117/14 |

FOREIGN PATENT DOCUMENTS

| | | | |
|---|---|---|---|
| 0450502A | 10/1991 | European Pat. Off. | 117/14 |
| 63-239181 | 10/1988 | Japan | C30B 15/26 |
| 63-256594 | 10/1988 | Japan | C30B 15/26 |
| 3112886A | 5/1991 | Japan | 117/14 |
| 4300283A | 10/1992 | Japan | 117/14 |

*Primary Examiner*—Felisa Garrett
*Attorney, Agent, or Firm*—Senniger, Powers, Leavitt & Roedel

[57] ABSTRACT

System and method for determining the diameter of a silicon crystal being pulled from a silicon melt for controlling a silicon crystal growing apparatus. The melt has a surface with a meniscus which is visible as a bright ring adjacent the crystal. A camera generates an image pattern of a portion of the bright ring adjacent the crystal. Image processing circuitry detects a characteristic of the image pattern and defines an edge of the bright ring as a function of the detected characteristic. The image processing circuitry further defines a generally circular shape including the defined edge of the bright ring. The diameter of the crystal is then determined based on the diameter of the defined shape for use in controlling the crystal growing apparatus.

15 Claims, 11 Drawing Sheets

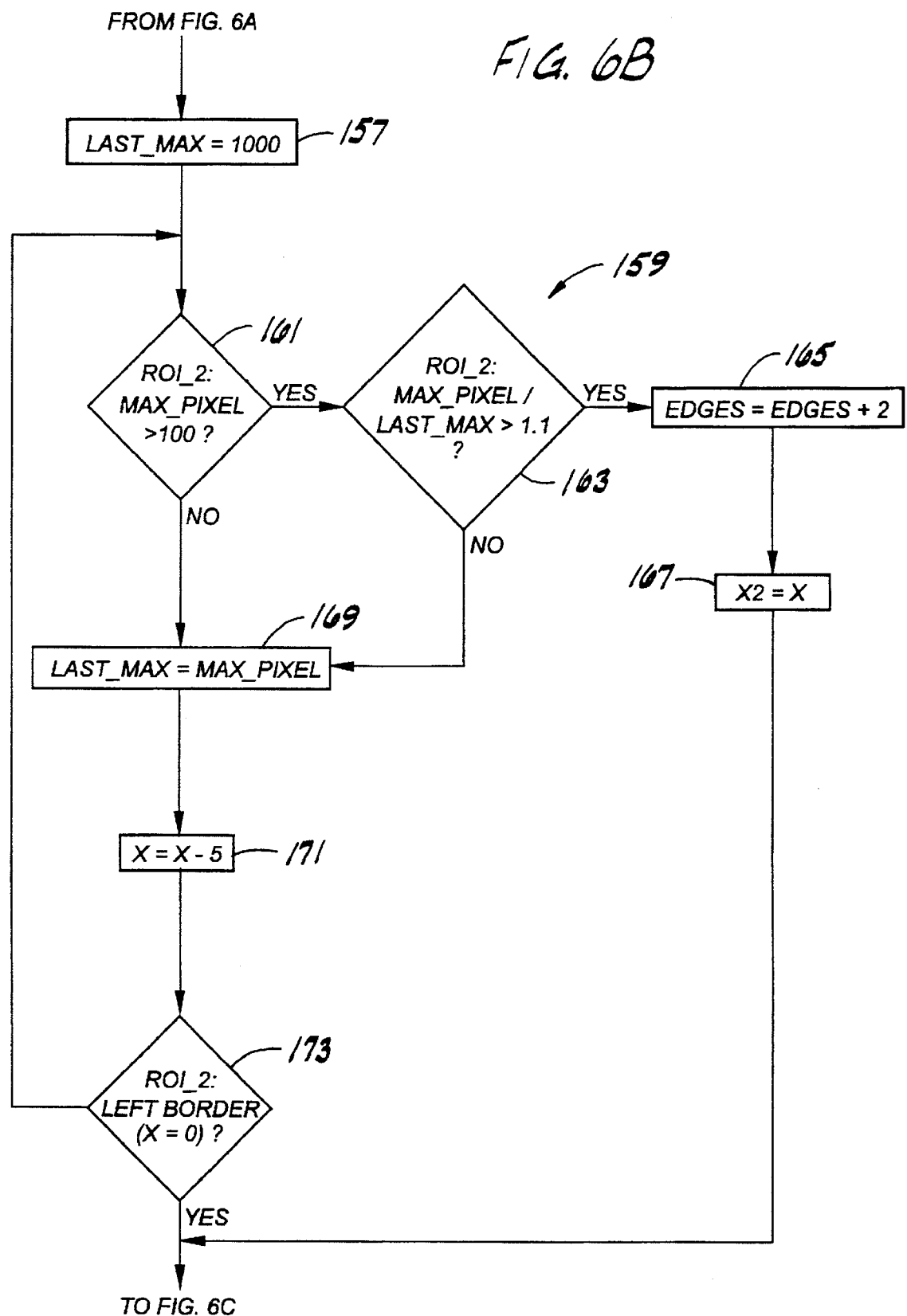

METHOD FOR CONTROLLING GROWTH OF A SILICON CRYSTAL

NOTICE

Copyright© 1995 MEMC Electronic Materials, Inc. A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

This invention relates to an improved system and method for measuring the diameter of silicon crystals grown by the Czochralski process and, in particular, a system or method for use in controlling an apparatus or method employing the Czochralski process.

The substantial majority of monocrystalline silicon used to make silicon wafers for the microelectronics industry is produced by crystal pulling machines employing the Czochralski process. Briefly described, the Czochralski process involves melting chunks of high-purity polycrystalline silicon in a quartz crucible located in a specifically designed furnace to form a silicon melt. A relatively small seed crystal is mounted above the crucible on the lower end of a pull wire hanging from a crystal lifting mechanism for raising and lowering the seed crystal. The crystal lifting mechanism lowers the seed crystal into contact with the molten silicon in the crucible. When the seed begins to melt, the mechanism slowly withdraws it from the silicon melt. As the seed is withdrawn, it grows drawing silicon from the melt. During the growth process, the crucible is rotated in one direction and the crystal lifting mechanism, wire, seed, and crystal are rotated in an opposite direction.

As crystal growth is initiated, the thermal shock of contacting the seed with the melt may cause dislocations in the crystal. The dislocations are propagated throughout the growing crystal and multiplied unless they are eliminated in the neck region between the seed crystal and the main body of the crystal. The known methods of eliminating dislocations within silicon single crystal involve growing a neck having a small diameter at a relatively high crystal pull rate to completely eliminate dislocations before growing the body of the crystal. After dislocations are eliminated in the neck, its diameter is enlarged until the desired diameter of the main crystal body is reached. When the neck, which is the weakest part of the crystal, has too small of a diameter, it can fracture during crystal growth, causing the body of the crystal to drop into the crucible. The impact of the crystal ingot and splashing molten silicon can cause damage to the crystal growing apparatus as well as present a serious safety hazard.

As is known in the art, the Czochralski process is controlled, in part, as a function of the diameter of the crystal being grown. Thus, for both control and safety reasons, an accurate and reliable system for measuring crystal diameter, including neck diameter, is needed.

Several technologies are known for providing crystal diameter measurements including methods of measuring the width of the bright ring. The bright ring is a characteristic of the reflection of the crucible wall in the meniscus which is formed at the solid-liquid interface. Conventional bright ring and meniscus sensors employ optical pyrometers, photocells, rotating mirrors with photocells, light sources with photocells, line-scan cameras, and two-dimensional array cameras. U.S. Pat. Nos. 3,740,563, 5,138,179 and 5,240,684, the entire disclosures of which are incorporated herein by reference, disclose methods and apparatus for determining the diameter of a crystal during the crystal growth process.

Unfortunately, conventional apparatus for automatically measuring crystal width are not sufficiently accurate or reliable for use during the different phases of crystal growth or for large diameter crystals in which the true maximum of the bright ring may be obscured from view by the solid body of the crystal itself. In an effort to correct this problem, conventional apparatus for measuring crystal width attempt to measure the meniscus at a chord or at a single point along the meniscus. However, such apparatus require precise mechanical positioning of the scanning device and are highly sensitive to fluctuations in melt level. Further, conventional measuring apparatus require frequent calibration by the operator of the crystal growing apparatus to ensure that the diameter remains within specification.

In addition to the problems described above, conventional apparatus for automatically measuring crystal diameter fail to provide accurate measurements when the crystal orbits, or moves in a pendular manner, as it is pulled from the melt. Known measurement apparatus are also unable to discriminate between the bright ring and reflections on the melt surface or on the growing crystal itself, resulting in unreliable measurements. Further, such apparatus are often unable to provide measurements when the viewport window is blocked by, for example, splashes of silicon.

Another disadvantage with conventional systems and methods for measuring crystal diameter is that they are unable to provide additional information regarding the crystal growth process, such as a measure of melt level and an indication of a loss of zero dislocation growth.

For these reasons, conventional apparatus fail to provide an accurate and reliable system of automatically determining crystal diameter for controlling the crystal growth process.

SUMMARY OF THE INVENTION

Among the objects and features of the present invention may be noted the provision of an improved system and method of control and operation which overcome at least some of the disadvantageous conditions described above; the provision of such system and method which provide accurate and reliable measurements of crystal diameter during the growth process; the provision of such system and method which compensate for errors caused by distortion due to camera angle; the provision of such system and method which is not affected by movement of the crystal during the growth process; the provision of such system and method which provide accurate and reliable measurements of melt level; the provision of such system and method which provide an indication of a loss of zero dislocation growth; and the provision of such system which is economically feasible and commercially practical and such method which can be carried out efficiently and relatively inexpensively.

Briefly described, a system embodying aspects of the present invention is for use in combination with an apparatus for growing a silicon crystal from a silicon melt. The system determines a dimension of the crystal being pulled from the melt wherein melt has a surface with a meniscus which is visible as a bright area adjacent the crystal. The system includes a camera for generating an image pattern of a portion of the bright area adjacent the silicon crystal and a detection circuit for detecting a characteristic of the image pattern. The system also includes a defining circuit for defining an edge of the bright area as a function of the detected characteristic and for defining a shape including the defined edge of the bright area. A measurement circuit determines a dimension of the defined shape whereby the dimension of the silicon crystal is determined as a function of the determined dimension of the defined shape.

Generally, another form of the invention is a method for use in combination with an apparatus for growing a silicon crystal from a silicon melt. The method determines a dimension of the crystal being pulled from the melt wherein melt has a surface with a meniscus which is visible as a bright area adjacent the crystal. The method includes the steps of generating an image pattern of a portion of the bright area adjacent the silicon crystal and detecting a characteristic of the image pattern. The method also includes defining an edge of the bright area as a function of the detected characteristic and defining a shape including the defined edge of the bright area. The method further includes the step of determining a dimension of the defined shape whereby the dimension of the silicon crystal is determined as a function of the determined dimension of the defined shape.

Alternatively, the invention may comprise various other systems and methods.

Other objects and features will be in part apparent and in part pointed out hereinafter.

BRIEF DESCRIPTION OF THE DRAWINGS

FIGS. 6A, 6B and 6C illustrate a flow diagram of the operation of the control unit of FIG. 2.

Corresponding reference characters indicate corresponding parts throughout the drawings.

DETAILED DESCRIPTION OF PREFERRED EMBODIMENTS

Figure 1:
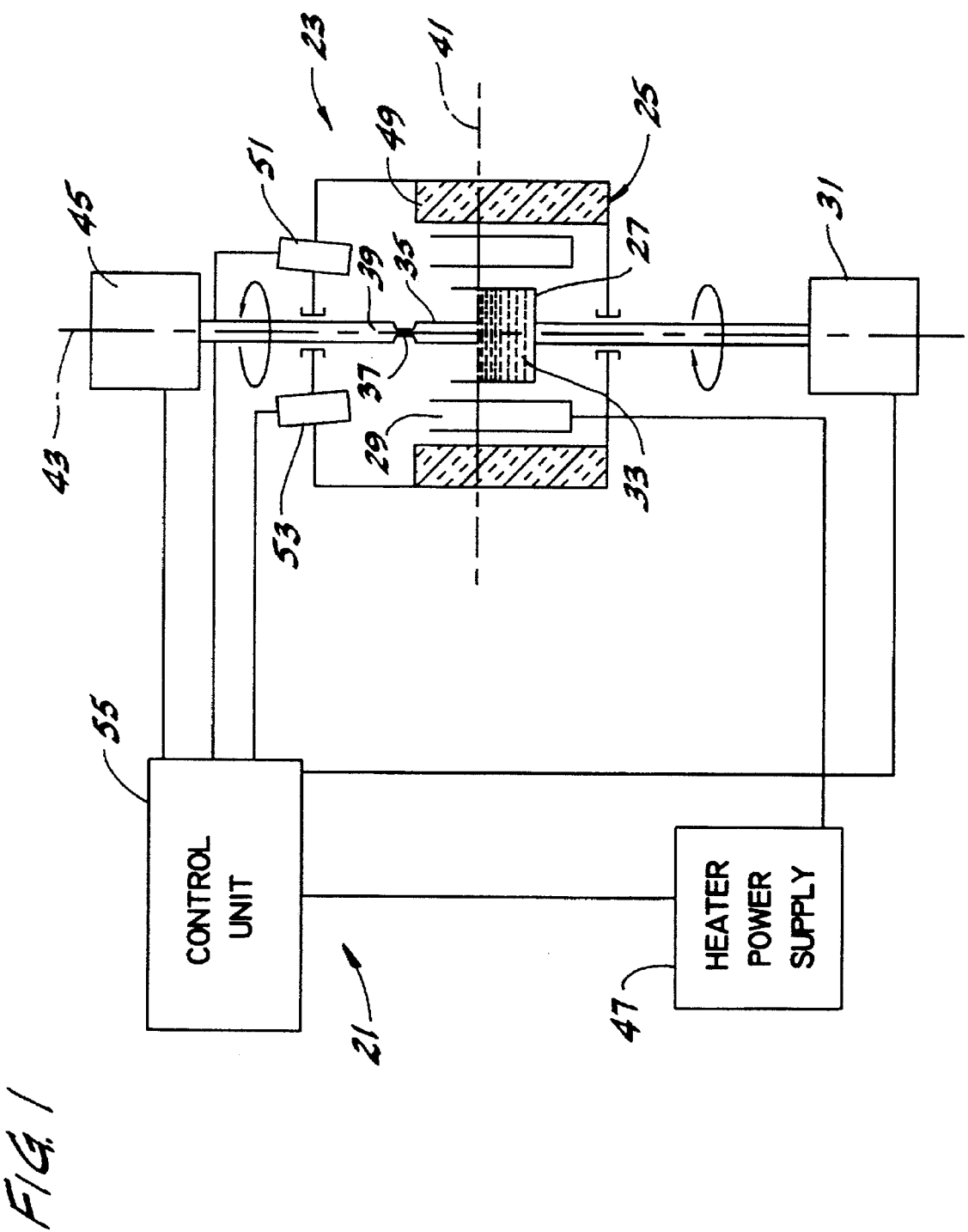
FIG. 1 is an illustration of a crystal growing apparatus and a system for controlling the crystal growing apparatus according to the present invention.

Referring now to FIG. 1, a system 21 is illustrated for use with a Czochralski crystal growing apparatus 23 in accordance with the present invention. In the illustrated embodiment, the crystal growing apparatus 23 includes a vacuum chamber 25 enclosing a crucible 27 which is surrounded by a resistance heater 29 or other heating means. Generally, a crucible drive unit 31 rotates the crucible 27 in the clockwise direction, as indicated by the arrow, and raises and lowers crucible 27 as desired during the growth process. Crucible 27 contains a silicon melt 33 from which a single crystal 35 is pulled, starting with a seed crystal 37 attached to a pull shaft or cable 39. As shown in FIG. 1, the melt 33 has a melt level 41, and crucible 27 and the single crystal 35 have a common vertical axis of symmetry 43.

According to the Czochralski crystal growth process, a crystal drive unit 45 rotates the cable 39 in the opposite direction that crucible drive unit 31 rotates crucible 27. The crystal drive unit 45 also raises and lowers crystal 35 as desired during the growth process. A heater power supply 47 energizes the resistance heater 29 and insulation 49 lines the inner wall of the vacuum chamber 25. An inert atmosphere of argon gas is preferably fed into vacuum chamber 25 as gas is removed from within vacuum chamber 25 by a vacuum pump (not shown). In one embodiment, a chamber cooling jacket (not shown) fed with cooling water may surround vacuum chamber 25. Preferably, a temperature sensor 51, such as a photo cell, measures the melt surface temperature.

Figure 2:
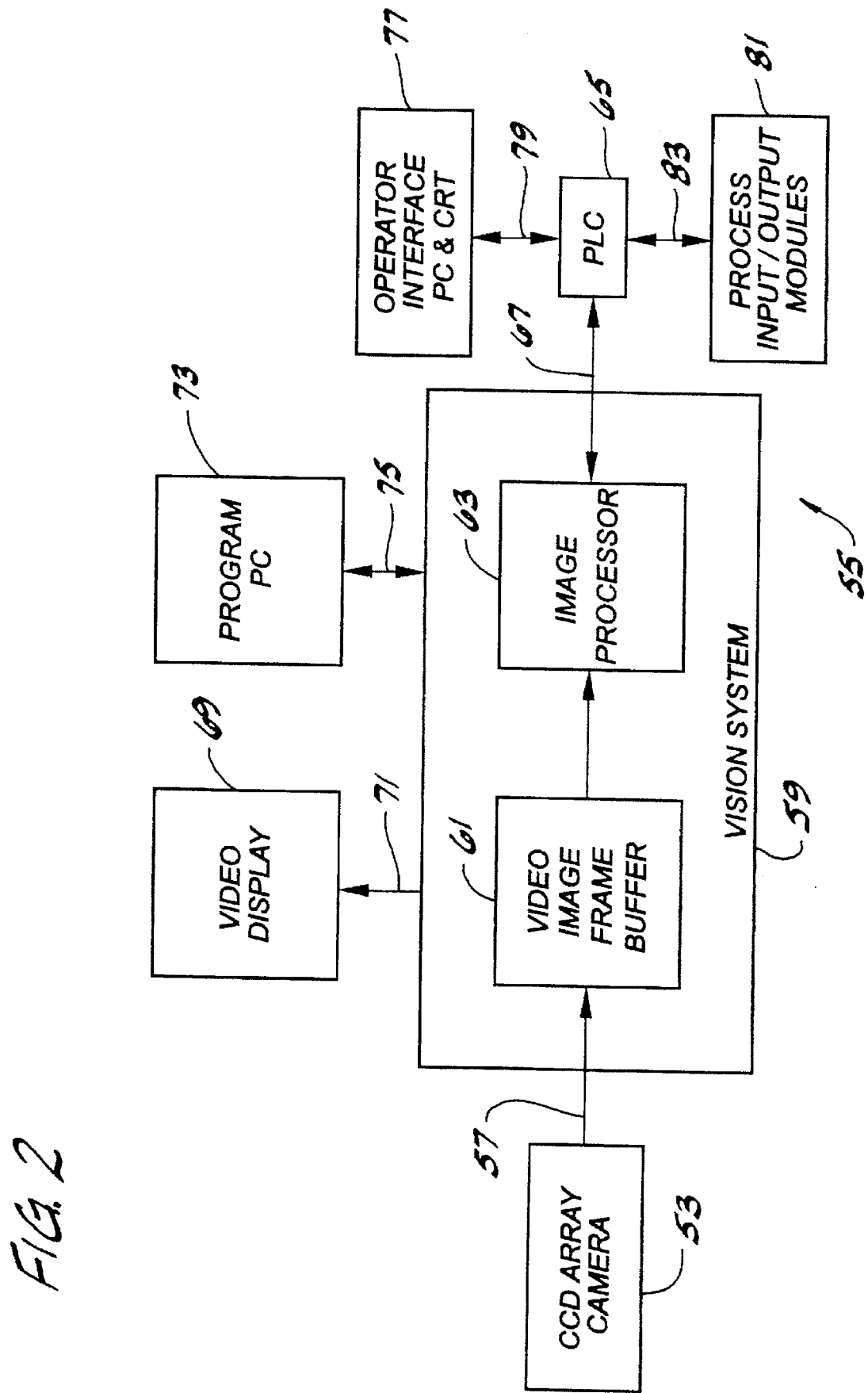
FIG. 2 is a block diagram of a control unit of the system of FIG. 1.

In a preferred embodiment of the invention, at least one two-dimensional camera 53 is for use with a control unit 55 to determine the diameter of single crystal 35. The control unit 55 processes signals from the temperature sensor 51 as well as the camera 53. As shown in FIG. 2, control unit 55 includes a programmed digital or analog computer for use in controlling, among other things, crucible drive unit 31, single crystal drive unit 45 and the heater power supply 47.

Referring further to FIG. 1, according to a general silicon single crystal growth process, a quantity of polycrystalline silicon is charged to crucible 27. Heater power supply 47 provides electric current through heater 29 to melt the charge. Crystal drive unit 45 lowers the seed crystal 37 via cable 39 into contact with the molten silicon of melt 33 contained by crucible 27. When seed crystal 37 begins to melt, crystal drive unit 45 slowly withdraws, or pulls, it from melt 33. Seed crystal 37 draws silicon from melt 33 to produce a growth of silicon single crystal 35 as it is pulled from melt 33. Before seed crystal 37 contacts melt 33, it may first be necessary to lower seed crystal 37 nearly in contact with melt 33 for preheating seed crystal 37.

Crystal drive unit 45 rotates crystal 35 at a predetermined reference rate as it is pulled from melt 33. Crucible drive unit 31 similarly rotates crucible 27 at a second predetermined reference rate, but usually in the opposite direction relative to crystal 35. Control unit 55 initially controls the withdrawal, or pull, rate and the power supplied to heater 29 by power supply 47 to cause a neck down of crystal 35. Preferably, control unit 55 then adjusts these parameters to cause the diameter of crystal 35 to increase in a cone-shaped manner until a predetermined desired crystal diameter is reached. Once the desired crystal diameter is reached, control unit 55 controls the pull rate and heating to maintain constant diameter as measured by system 21 until the process approaches its end. At that point, the pull rate and heating are increased so that the diameter decreases to form a tapered portion at the end of single crystal 35.

As described above, accurate and reliable control is desired during the crystal growth process, particularly in the neck portion of crystal 35. The neck is preferably grown at a substantially constant diameter as seed crystal 37 is drawn from melt 33. For example, control unit 55 causes a substantially constant neck diameter to be maintained so that the neck diameter remains within fifteen percent of the desired diameter. As is known in the art, the top portion of the neck adjacent seed crystal 37 may contain dislocations (not shown) first introduced by the thermal shock associated with bringing the dislocation-free seed crystal 37 into contact with silicon melt 33. As is known in the art, excessive fluctuations in neck diameter may also cause dislocations to form.

Commonly assigned U.S. Pat. No. 5,178,720, the entire disclosure of which is incorporated herein by reference, discloses a preferred method for controlling crystal and crucible rotation rates as a function of the crystal diameter.

FIG. 2 illustrates a preferred embodiment of control unit 55 in block diagram form. According to the present invention, camera 53 is preferably a monochrome charge coupled device (CCD) camera, such as a Sony XC-75 CCD video camera having a resolution of 768×494 pixels. Camera 53 is mounted in a viewport (not shown) of chamber 25 at an angle of approximately 34° with respect to the vertical axis 43 and is aimed generally at the intersection of axis 43 and melt 33 at the melt level 41 (see FIG. 3).

Camera 53 generates a video image of the width of crystal 35 as it is pulled from melt 33 including an image of a portion of the meniscus (see FIG. 3) at the interface between melt 33 and crystal 35. Preferably, the lens of camera 53 is a 16 mm lens providing a field of view of at least approximately 300 mm. Camera 53 communicates the video image via line 57 (e.g., RS-170 video cable) to a vision system 59. As shown in FIG. 2, the vision system 59 includes a video image frame buffer 61 and an image processor 63. As an example, vision system 59 is a Cognex CVS-400 vision system. In turn, vision system 59 communicates with a programmable logic controller (PLC) 65 via line 67. In one preferred embodiment, the PLC 65 is a Model 575 PLC manufactured by Siemens and line 67 represents a VME backplane interface.

Referring further to FIG. 2, vision system 59 also communicates with a video display 69 via line 71 (e.g., RS-170 RGB video cable) and with a personal computer 73 via line 75 (e.g., RS-232 cable). In a preferred embodiment, the video display 69 displays the video image generated by camera 53 and the computer 73 is used to program vision system 59.

In the illustrated embodiment, PLC 65 communicates with an operator interface computer 77 via line 79 (e.g., RS-232 cable) and with one or more process input/output modules 81 via line 83 (e.g., RS-485 cable). The operator interface computer 77 permits the operator of crystal growing apparatus 23 to input a set of desired parameters for the particular crystal being grown. The process input/output module 81 provides a path to and from crystal growing apparatus 23 for controlling the growth process. As an example, PLC 65 receives information regarding the melt temperature from temperature sensor 51 and outputs a control signal to heater power supply 47 via process input/output module 81 for controlling the melt temperature thereby controlling the growth process.

Figure 3:
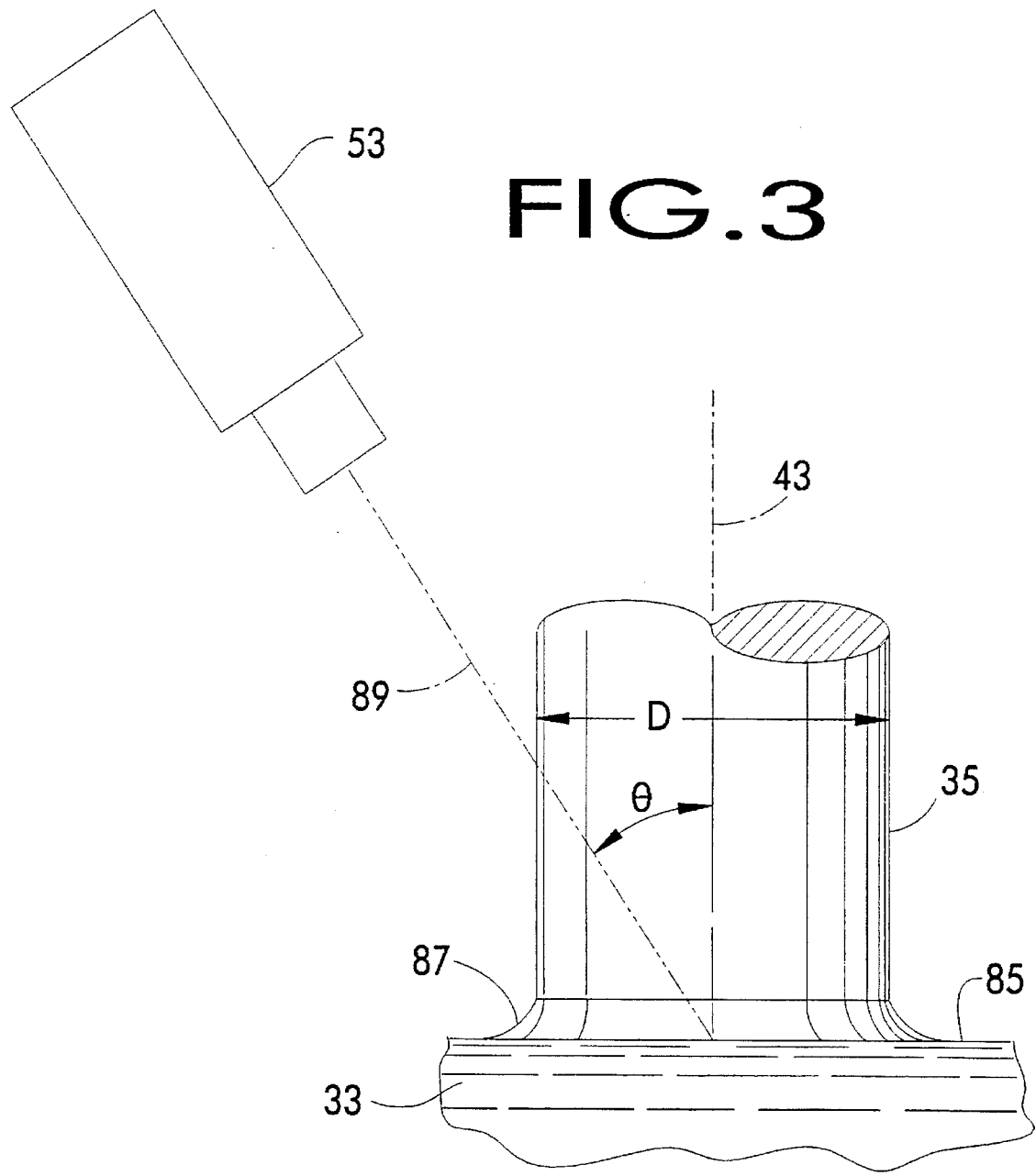
FIG. 3 is a fragmentary view of a silicon crystal being pulled from a melt.

FIG. 3 is a fragmentary view of silicon crystal 35 being pulled from melt 33. Crystal 35 constitutes a generally cylindrical body of crystalline silicon and is preferably an ingot of crystalline silicon having vertical axis 43 and a diameter D. It should be understood that an as-grown crystal, such as crystal 35, may not have a uniform diameter, although it is generally cylindrical. For this reason, diameter D may vary slightly at different axial positions along axis 43. Further, diameter D will vary in the different phases of crystal growth (e.g., seed, neck, crown, shoulder, body and end cone). FIG. 3 also illustrates a surface 85 of melt 33 having a liquid meniscus 87 formed at the interface between crystal 35 and melt 33. As is known in the art, the reflection of crucible 27 on the meniscus 87 is typically visible as a bright ring adjacent crystal 35.

As described above, camera 53 is preferably mounted in a viewport (not shown) of chamber 25 aimed generally at the intersection of axis 43 and melt 33. In other words, camera 53 has an optical axis 89 that is at an acute angle Θ with respect to vertical axis 43. As an example, Θ is approximately 34°. Further, the lens of camera 53 preferably provides a field of view including the width of crystal 35 and including at least a portion of the bright ring of meniscus 87. In a preferred embodiment, proper lens selection provides both telephoto viewing for high resolution of small seeds and necks as well as wide angle viewing for the larger body portion of crystal 35.

Figure 4:
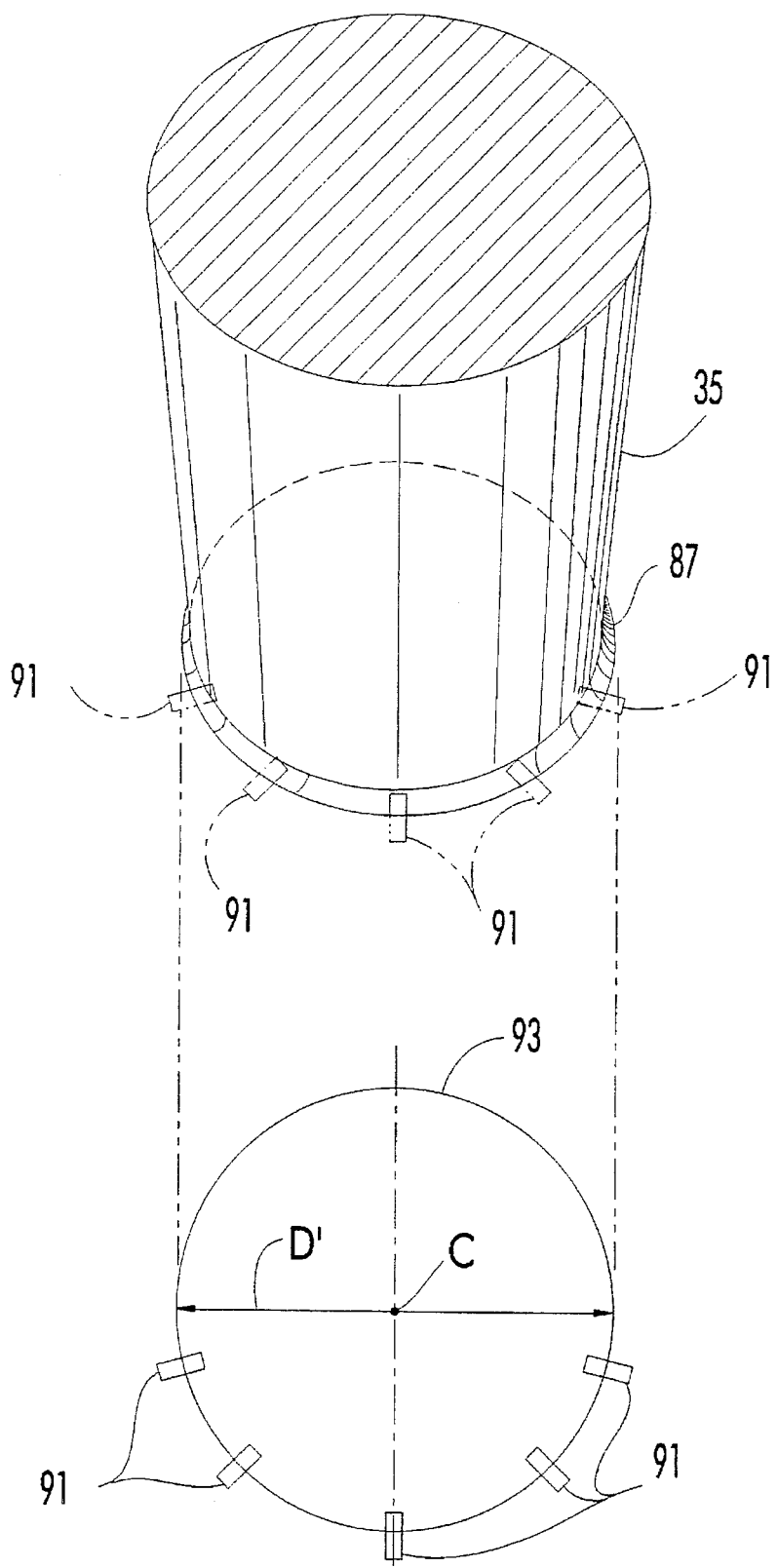
FIG. 4 is a fragmentary and cross-sectional perspective view of the crystal of FIG. 3.

Referring now to FIG. 4, an exemplary view of crystal 35, including meniscus 87, is shown as viewed through the viewport of chamber 25 by camera 53. According to a preferred embodiment of the invention, the frame buffer 61 of vision system 59 receives the video image signal from camera 53 and captures an image pattern for processing by the image processor 63. In general, image processor 63 performs digital edge-detection to locate the coordinates of at least three points around the inside or outside of the bright ring of meniscus 87. Since the cross-section of crystal 35 and meniscus 87 is known to be generally circular, the bright ring edge coordinates detected by image processor 63 are assumed to be elliptical, transformed and mapped into a circular shape. In the alternative, the edge coordinates can be mapped into a circular shape by compensating for the distortion caused by the angle at which camera 53 is mounted. Gonzalez and Wintz, *Digital Image Processing*, 1987, pages 36–52, incorporated herein by reference, disclose mathematical transformations for compensating for perspective distortion caused by the position of a camera with respect to a three-dimensional object. Such transformations may be used to extract a circular shape from a distorted elliptical shape.

In one preferred embodiment of the invention, image processor 63 defines at least three, and preferably five or more, regions of interest 91 on the image generated by camera 53 which is captured by frame buffer 61. Image processor 63 examines the regions of interest 91, also referred to as edge tools or window regions, for a characteristic of the image pattern, such as the intensity or gradient of the intensity of the pixels included in each region 91. Based on the detected characteristic of the image pattern, image processor 63 determines edge coordinates along the outside of the bright ring of meniscus 87. Preferably, regions 91 are defined at preselected positions that generally correspond to positions along a curve matching the expected shape of the bright ring as viewed by camera 53. In other words, regions 91 are positioned radially with respect to a defined center point along the bottom half of an ellipse or circle to approximate the shape of the bright ring. By defining regions 91 at preselected positions approximating the shape of a portion of the bright ring, regions 91 avoid known or expected reflections on the surface 85 of melt 33 that might cause spurious measurements. Also, since image processor 63 defines a number of regions 91, if part of the viewport of chamber 25 is blocked, image processor 63 is still able to detect the edges of the bright ring. It is to be understood that other characteristics of the image pattern, such as color or contrast, may be detected for finding edge coordinates of the bright ring of meniscus 87 in addition to intensity or intensity gradient.

FIG. 4 illustrates a set of preferred positions at which regions 91 are defined. As shown, the left-most and rightmost regions 91 are preferably located below the y coordinate of the center point C. Thus, system 21 operating in accordance with the present invention is not subject to errors caused when the body of crystal 35 obscures the maximum width of the bright ring as it is viewed through the viewport of chamber 25. Advantageously, the present invention overcomes this problem caused by perspective distortion which is particularly troublesome for large diameter crystals (e.g., 200 mm and larger).

As described above, crystal 35 is pulled from melt 33 generally along vertical axis 43 which is generally perpendicular to melt surface 85. During pulling, crystal 35 may move relative to vertical axis 43. Advantageously, regions 91 are large enough so that edge coordinates of the bright ring may be defined within regions 91 even though crystal 35 is moving. Image processor 63 further dynamically moves the preselected positions of regions 91 so that they are adjacent the imaged portion of the bright ring to follow the crystal diameter throughout all phases of growth (e.g., seed, neck, crown, shoulder, body and end cone). In other words, regions 91 track crystal diameters from approximately 4 mm to 320 mm. As is known in the art, however, the bright ring is not always visible during all phases of growth. For example, during growth of the crown portion of crystal 35, the bright ring may be relatively small or not visible. For this reason, system 21 preferably detects the perimeter of the crown which appears as a bright area relative to the intensity of the background of the image pattern. In this instance, the background of the image pattern is representative of melt surface 85. Thus, in the alternative to detecting the bright ring, system 21 detects the bright area associated with the crown of crystal 35.

In a preferred embodiment, the coordinates of the edges of the bright ring detected within regions 91 are mathematically transformed to compensate for perspective distortion and then input into a best-fit circle measurement. For example, image processor 63 uses a Hough transform or least-squares fit to define a circular shape corresponding to the detected edges. According to the invention, image processor 63 defines a generally circular shape 93 having a circle diameter D' and a center point C based on the detected coordinates. Practically, at least three edge coordinates are needed to define circle 93.

In order to obtain an accurate measurement of the diameter D of crystal 35 for use by PLC 65 in controlling the crystal growth process, image processor 63 first digitally processes the diameter D' of defined circle 93. In this manner, image processor 63 uses the dimensions of circle 93 to determine crystal diameter D, a measure of the quality of fit relative to an exact circle, and melt level 41. For purposes of this application, melt level 41 is defined as the distance from the top of heater 29 to surface 85 of melt 33 and may be determined as a function of the coordinates of center point C.

In operation, image processor 63 defines regions 91 adjacent the portion of the bright ring and detects an intensity gradient characteristic of the image pattern within regions 91. Image processor 63 further defines the coordinates of an edge of the bright ring within each region 91 as a function of the detected characteristic and defines generally circular shape 93 including the defined edge coordinates. The diameter D of crystal 35 is then determined based on defined circular shape 93 for use in controlling the crystal growth process. PLC 65 of control unit 55 is responsive to the determined diameter D of silicon crystal 35 for controlling the rates at which crucible 27 and crystal 35 are rotated and/or the rate at which crystal 35 is pulled from melt 33 and/or the temperature of melt 33 and is responsive to the determination of melt level 41 for controlling the level of crucible 27 thereby to control crystal growth apparatus 23. Thus, image processor 63 constitutes a detection circuit, a defining circuit and a measurement circuit and PLC 65 constitutes a control circuit.

In one preferred embodiment of the invention, the diameter D' is measured in terms of radius pixels. As an example, crystal diameter D (mm)=CF(radius pixels)−3.02 mm where CF is a calibration factor between 0.95 and 1.05 and 3.02 mm compensates for the width of the bright ring. The value of 3.02 mm is determined by analyzing data from grown necks and the calibration factor CF is an operator-entered value based on a measured value. According to the invention, the operator of crystal growth apparatus 23 measures the growing crystal 35 with a telescope that slides on a calibrated track and then inputs a value of CF via computer 77 so that the determined diameter D equals the measured value. In this manner, CF compensates for variability in the diameter measurement. Such variability is due primarily to changes in the distance between camera 53 and crystal 35 which affect the magnification of the optics. Increasing the distance causes crystal 35 to appear smaller which may result in the actual crystal 35 being grown oversized. These changes in distance can occur from one crystal growth apparatus 23 to another, from one run to another, and even within a single run because of variability in melt level 41.

With respect to melt level 41, image processor 63 determines center point C which is indicative of melt level 41. According to the invention, the difference between the y coordinate of center point C and a reference value is used to determine melt level 41. Alternatively, commercially available optical methods (e.g., a light beam/detector apparatus mounted on the cover plate of chamber 25) may be used to determine melt level 41. The determination of melt level 41 may be used to reduce variability of diameter measurements by the calculation of a correction factor and by reducing melt level variation through lift control of crucible 27.

Another primary source of variability in the diameter measurements is that the width of the bright ring changes depending on the height of the hot wall of crucible 27 which is exposed and reflected by liquid meniscus 87. As melt 33 is depleted, the width of the bright ring increases which causes crystal 35 to appear larger and may result in the actual crystal 35 being grown undersized. As an alternative to using the 3.02 mm constant, the bright ring width can be calculated by using additional vision tools or mathematical modeling. For example, detecting the edge between crystal 35 and the bright ring, in addition to detecting the edge between melt 33 and the bright ring, provides a measure of bright ring width. Further, mathematical modeling of liquid meniscus 87 taking into account its reflective characteristics with respect to crucible wall height, provides a measure of bright ring width.

In an alternative embodiment, the five edge coordinates of the bright ring defined within regions 91 of the image pattern are used to detect periodic deviations in crystal diameter with respect to the rate at which crystal drive unit 45 rotates crystal 35. As is known in the art, <100> zero dislocation growth is indicated by facets, or growth lines, generally parallel to vertical axis 43 and spaced apart along the body of crystal 35. These growth lines appear as dimple-like features on the perimeter of a cross-section of crystal 35. For this reason, as crystal 35 rotates at a known rate, growth lines are expected within a particular region 91 at a rate of four times, for example, the rate of rotation. As such, image processor 63 confirms zero dislocation growth of crystal 35 and constitutes means for detecting periodic deviation in the determined diameter of defined circular shape 93.

Further, it is to be understood that vision system 59 of the present invention may be used to determine other crystal growth parameters, such as purge tube gap or melt gap, complete meltdown, ice, convection currents and temperature, in addition to crystal diameter, melt level and loss of zero dislocation growth.

Figure 5:
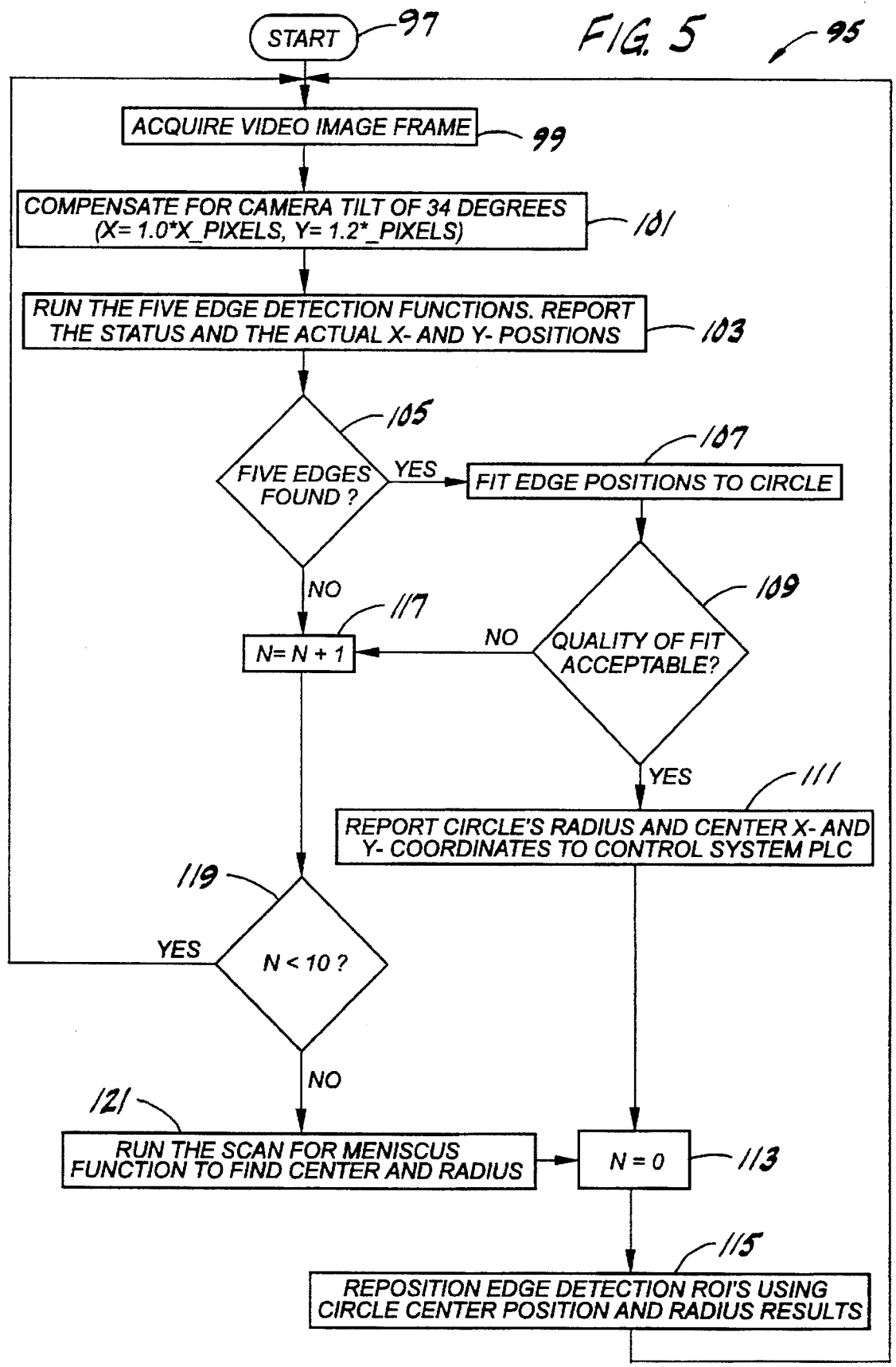
FIG. 5 illustrates a flow diagram of the operation of the control unit of FIG. 2.

FIG. 5 illustrates the operation of system 21 according to one preferred embodiment of the invention in the form of a flow diagram 95. After beginning at step 97, frame buffer 61 acquires an image pattern from camera 53 at step 99. Image processor 63 receives the captured image and adjusts its pixel values to compensate for distortion of the image pattern caused by the camera angle. This is accomplished by scaling the y values of the image pattern ($y_{pixel}$) by a factor of 1.2, as derived from $\cos\Theta$, at step 101 to define y values. Preferably, $x = x_{pixel}$. Thus, image processor 63, performing step 101, constitutes means for adjusting the image pattern so that the portion of the bright area adjacent crystal 35 is generally arcuate.

At step 103, image processor 63 of vision system 59 performs edge detection by examining the gradient of the intensity of the pixels within each region of interest 91. The gradient is obtained by taking the derivative of the relative intensity of the image pattern within each region 91. Thus, image processor 63 identifies the coordinates of the greatest change in intensity within each region 91 which is indicative of an edge of the bright ring. At step 105, if five edge coordinates are defined, image processor 63 proceeds to step 107 for fitting the defined edge coordinates to a generally circular shape by means of a circle-fitting algorithm, such as the Hough transform or least-squares fit. For example, the Hough transform uses sorting routines to develop clusters of data points that can be used to find circles and then finds the best cluster of data points for the desired object. The data is then averaged to find the center and radius of a fitted circle.

At step 109, vision system 59 determines the quality of the circle-fit by comparing the defined circular shape 93 to an exact circle. This determination provides an indication of the validity of the measurements. If the defined shape is sufficiently circular, vision system 59 communicates information representative of the diameter D' of defined circle 93 and the x-y coordinates of its center point C to PLC 65 of control unit 55 for use in controlling the crystal growth process. In the embodiment of flow diagram 95, vision system 59 reports the radius of circle 93. Thus, image processor 63 performing step 111, in cooperation with PLC 65, constitute means for determining the center of defined circular shape 93 with respect to a reference x-y coordinate system.

Operation of system 21 then proceeds to step 113 where a counter N is set to zero. Image processor 63 then re-positions regions 91 based on the determined center point and radius. According to one preferred embodiment of the invention, each of regions 91 is defined at a preselected radial position along the lower half of the defined circle (shown generally in FIG. 4). In this manner, regions 91 are essentially centered on the detected edge of the bright ring of meniscus 87 after each iteration of flow diagram 95, and image processor 63 responds to movement of crystal 35 during pulling as well as changes in diameter.

If the edge coordinates of the bright ring are not defined within regions 91 at step 105, image processor increments the counter N at step 117. Image processor 63 then repeats steps 99, 101, 103, 105 and 117 until N=10 at step 119, or until image processor 63 defines five edge coordinates. After ten unsuccessful attempts at defining the edge of the bright ring, image processor 63 searches for the general position of the bright ring by performing a scanning routine at step 121 (shown in greater detail in FIGS. 6A–6C). The scanning routine of step 121 finds the approximate location of meniscus 87 on the image pattern based on the intensity of the bright ring relative to the intensity of the background of the image pattern which, in this instance, is representative of melt surface 85. Image processor 83 determines an approximate center point and radius for defining the preselected positions of regions 91. Thus, image processor 63 performing steps 105, 113, 115, 117, 119 and 121 constitutes means for moving window regions 91 as a function of the detected characteristic and means for adjusting the preselected positions of window regions 91.

Figure 6A:
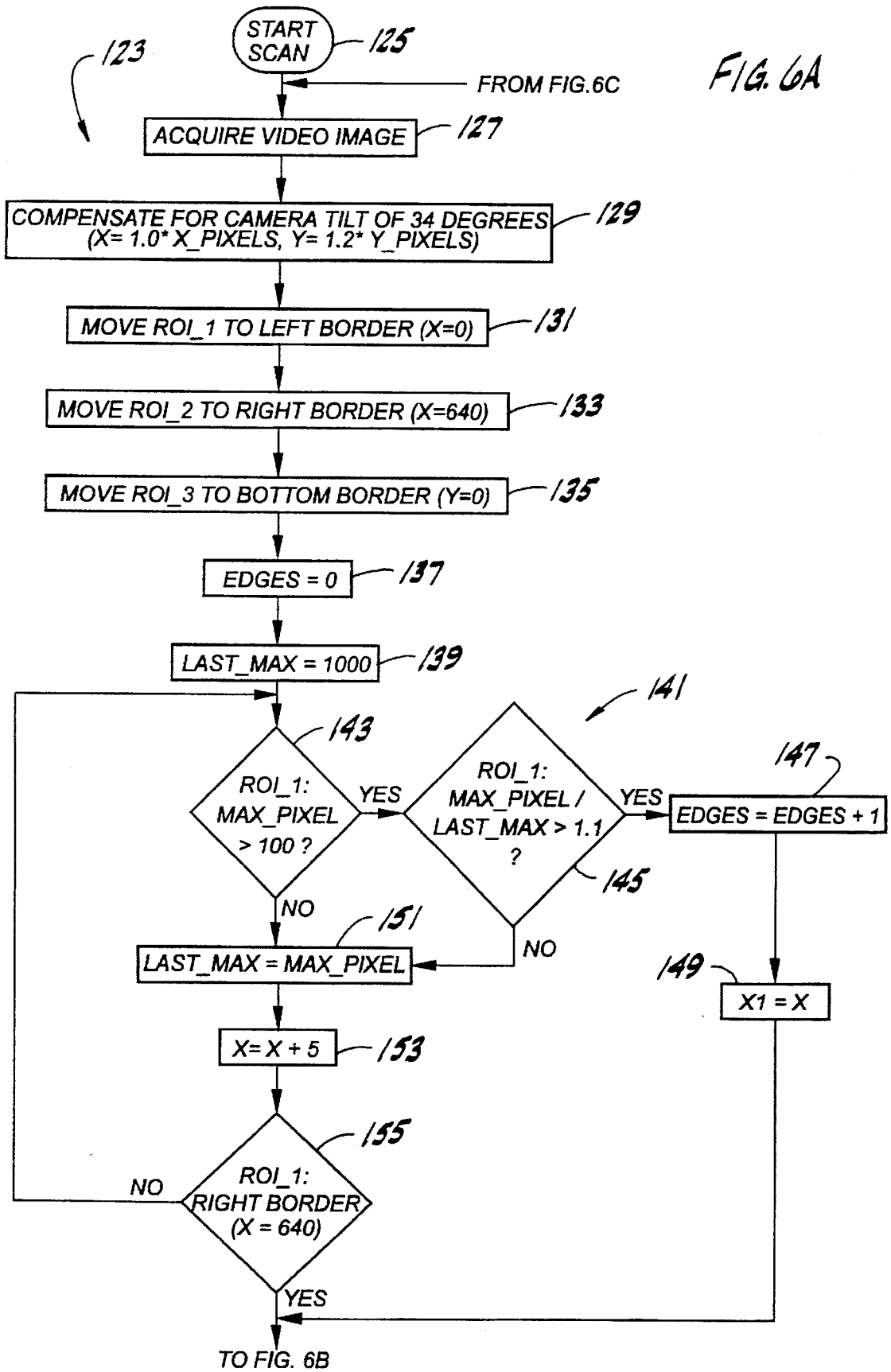
Figure 6C:
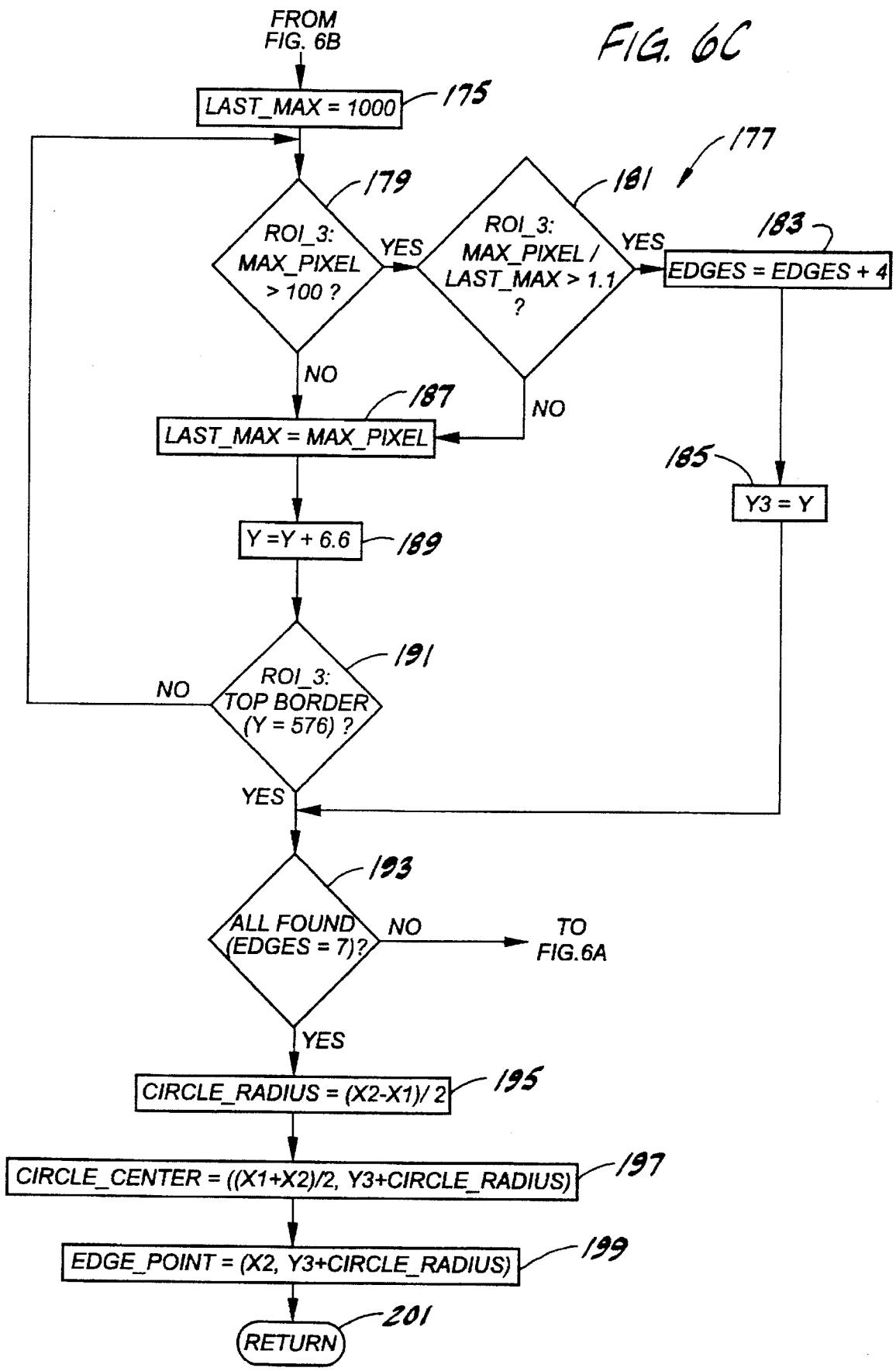

FIGS. 6A–6C illustrate a preferred scanning routine of step 121 of FIG. 5 in the form of a flow diagram 123. After beginning at step 125, frame buffer 61 acquires an image pattern from camera 53 at step 127. Image processor 63 receives the captured image and adjusts its pixel values to compensate for distortion of the image pattern caused by the camera angle at step 129. Proceeding to steps 131, 133 and 35, image processor 63 positions additional regions of interest, referred to as $ROI_1$, $ROI_2$ and $ROI_3$, at the left, right and bottom edges of the image pattern. These additional regions of interest, $ROI_1$, $ROI_2$ and $ROI_3$, are relatively larger than regions 91 and are also referred to as light meter tools. At step 137, the number of detected edges is set to zero and, at step 139, a parameter $LAST_{MAX}$, representative of the last maximum intensity reading, is set to a relatively high value (e.g., 1000).

In one preferred embodiment, a subroutine 141 is used to find the left edge of meniscus 87 by comparing the maximum intensity of the image pattern within $ROI_1$, i.e., $MAX_{PIXEL}$, to a threshold, such as 100. If $MAX_{PIXEL}$ exceeds 100 at step 143, image processor 63 proceeds to step 145 where the ratio $MAX_{PIXEL}:LAST_{MAX}$ is compared to 1.1. If the ratio exceeds 1.1, image processor 63 considers a left edge to be found within $ROI_1$ and increments the edge counter at step 147. The x coordinate of $ROI_1$ is then stored at step 149 for identifying the left edge of the bright ring. If $MAX_{PIXEL}$ is 100 or less at step 143, or if the ratio $MAX_{PIXEL}:LAST_{MAX}$ is 1.1 or less at step 145, $LAST_{MAX}$ is reset to equal $MAX_{PIXEL}$ at step 151. Image processor 63 then moves $ROI_1$ to the right by a predetermined amount. For example, at step 153, image processor re-positions $ROI_1$ five x coordinates to the right. So long as $ROI_1$ has not reached the right border of the image pattern, as determined at step 155, image processor 63 repeats subroutine 141.

Referring now to FIG. 6B, after image processor 63 detects the left edge of the bright ring within $ROI_1$ or after $ROI_1$ reaches the right border of the image pattern, image processor 63 resets $LAST_{MAX}$ to 1000 at step 157 and performs a subroutine 159 which is essentially identical to subroutine 141 but opposite in direction. The subroutine 159 is used to find the right edge of meniscus 87 by comparing the maximum intensity of the image pattern within $ROI_2$, i.e., $MAX_{PIXEL}$, to a threshold, such as 100. If $MAX_{PIXEL}$ exceeds 100 at step 161, image processor 63 proceeds to step 163 where the ratio $MAX_{PIXEL}:LAST_{MAX}$ is compared to 1.1. If the ratio exceeds 1.1, image processor 63 considers a right edge to be found within $ROI_2$ and increments the edge counter by two at step 165. The x coordinate of $ROI_2$ is then stored at step 167 for identifying the right edge of the bright ring. If $MAX_{PIXEL}$ is 100 or less at step 161, or if the ratio $MAX_{PIXEL}:LAST_{MAX}$ is 1.1 or less at step 159, $LAST_{MAX}$ is reset to equal $MAX_{PIXEL}$ at step 169. Image processor 63 then moves $ROI_2$ to the left by a predetermined amount. For example, at step 171, image processor re-positions $ROI_2$ five x coordinates to the left. So long as $ROI_2$ has not reached the left border of the image pattern, as determined at step 173, image processor 63 repeats subroutine 159.

Referring now to FIG. 6C, after image processor 63 detects the right edge of the bright ring within $ROI_2$ or after $ROI_2$ reaches the left border of the image pattern, image processor 63 resets $LAST_{MAX}$ to 1000 at step 175 and performs a subroutine 177 which is essentially identical to subroutines 141 and 159 but in the y direction. The subroutine 177 is used to find the bottom edge of meniscus 87 by comparing the maximum intensity of the image pattern within $ROI_3$, i.e., $MAX_{PIXEL}$, to a threshold, such as 100. If $MAX_{PIXEL}$ exceeds 100 at step 179, image processor 63 proceeds to step 181 where the ratio $MAX_{PIXEL}:LAST_{MAX}$ is compared to 1.1. If the ratio exceeds 1.1, image processor 63 considers a bottom edge to be found within $ROI_3$ and increments the edge counter by four at step 183. The y coordinate of $ROI_3$ is then stored at step 185 for identifying the bottom edge of the bright ring. If $MAX_{PIXEL}$ is 100 or less at step 179, or if the ratio $MAX_{PIXEL}:LAST_{MAX}$ is 1.1 or less at step 181, $LAST_{MAX}$ is reset to equal $MAX_{PIXEL}$ at step 187. Image processor 63 then moves $ROI_3$ toward the top of the image pattern by a predetermined amount. For example, at step 189, image processor re-positions $ROI_3$ 6.6 y coordinates toward the top. So long as $ROI_3$ has not reached the top border of the image pattern, as determined at step 191, image processor 63 repeats subroutine 177.

After the left, right and bottom edges of meniscus 87 have been found, as determined at step 193, image processor 63 proceeds to calculate an approximate circle radius at step 195 by dividing the difference in the x coordinates by two and proceeds to calculate the coordinates of the circle center at step 197 by finding the midpoint between the x coordinates and by adding the circle radius to the y coordinate of the bottom edge. At step 199, image processor 63 preferably calculates the coordinates of a point approximately on the right edge of the bright ring. According to the illustrated embodiment of the invention, the calculated radius, center point and edge point are used to position regions 91 approximately at the bright ring of meniscus 87 before processor 63 returns to operation according to flow diagram 95 of FIG. 5. On the other hand, if all of the edges are not found, as determined at step 193, image processor 63 returns to step 131 of flow diagram 123. At step 201, flow diagram 123 ends.

In an alternative embodiment of the invention, vision system 59 may be embodied as a computer having a frame grabber (e.g., Creative Technology's VideoBlaster®) for capturing the video image generated by camera 53. The computer, functioning as image processor 63, scans the image pattern and analyzes the individual intensity values of each scan line. Starting at the left and right edges of the image pattern and moving toward its center, the background (i.e., melt surface 85) intensities are measured and averaged. The scan continues until an abrupt increase in intensity is found or a predetermined number of samples have been taken. Binary thresholding is performed to identify the edges of the bright ring where the threshold consists of the average intensity value plus an empirical offset. A pair of window regions are defined for each scan line at positions generally symmetrical about the previously determined circle center's x coordinate to prevent extraneous reflections from being identified as valid edges. The windows apply a tolerance of ±n pixels from the reported edges of the previous scan line.

In this manner, changing crystal diameters and movement of crystal 35 during pulling are accommodated. By searching the image pattern from top to bottom, the left and right window regions are re-positioned at an equal rate toward the center from their respective borders until two valid edges are located. The window regions are then re-positioned with their centers on the edge. Each edge detected in subsequent scan lines are preferably within the window region from the previous scan line, thus, ensuring that the edges are connected. If a scan line fails tolerance checks, it is simply ignored, or if a predetermined number of lines fail, the search is restarted. Again, perspective distortion caused by the angle at which camera 53 is mounted may be compensated for by means such as the Gonzalez transformation. The validated edges are then fit to a circle for calculating the circle center point and circle diameter.

The following examples are presented to describe preferred embodiments and utilities of the present invention and are not meant to limit the present invention unless otherwise stated in the claims appended hereto.

EXAMPLES

Figure 7:
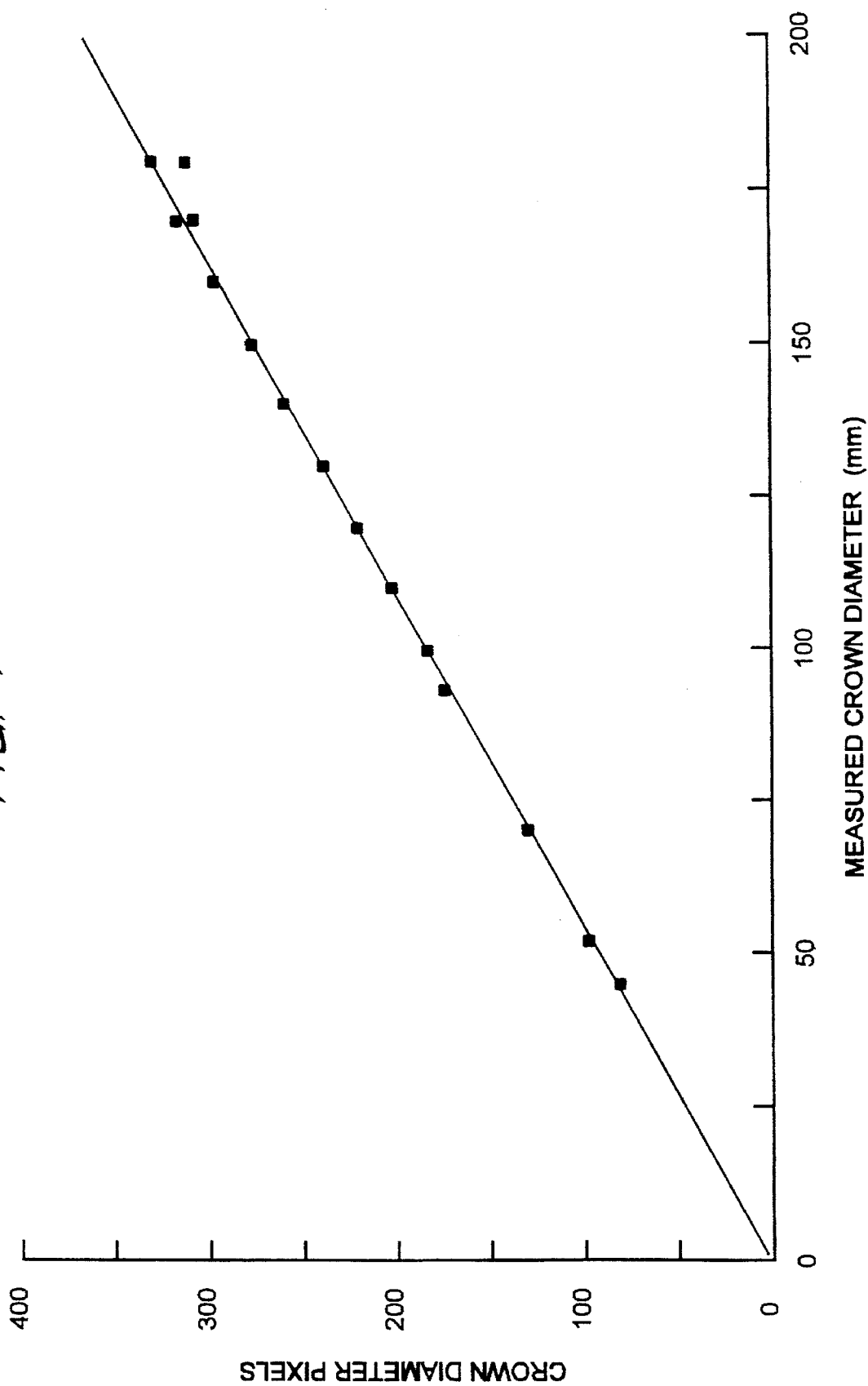
FIG. 7 is a graphical illustration of exemplary crystal crown measurements for the crystal growing apparatus and control system of FIG. 1.

1. FIG. 7 graphically illustrates diameter measurements in pixels versus diameter D in millimeters for the crown portion of crystal 35. As described above, vision system 59 determines the diameter of crystal 59 based on the width of defined circle 93 in terms of $x_{pixel}$ values which may be converted to millimeters. As shown in FIG. 7, approximately 1.8 $x_{pixel}$ values corresponds to one millimeter as measured by, for example, calipers.

Figure 8A:
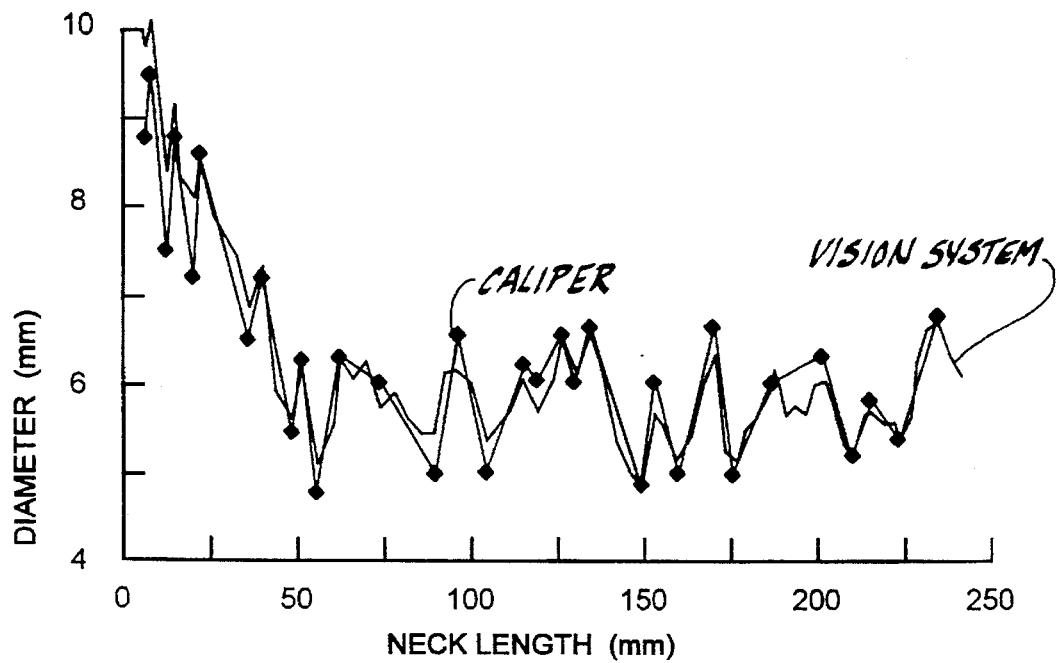
FIGS. 8A and 8B are graphical illustrations of exemplary crystal neck measurements for the crystal growing apparatus and control system of FIG. 1.
Figure 8B:
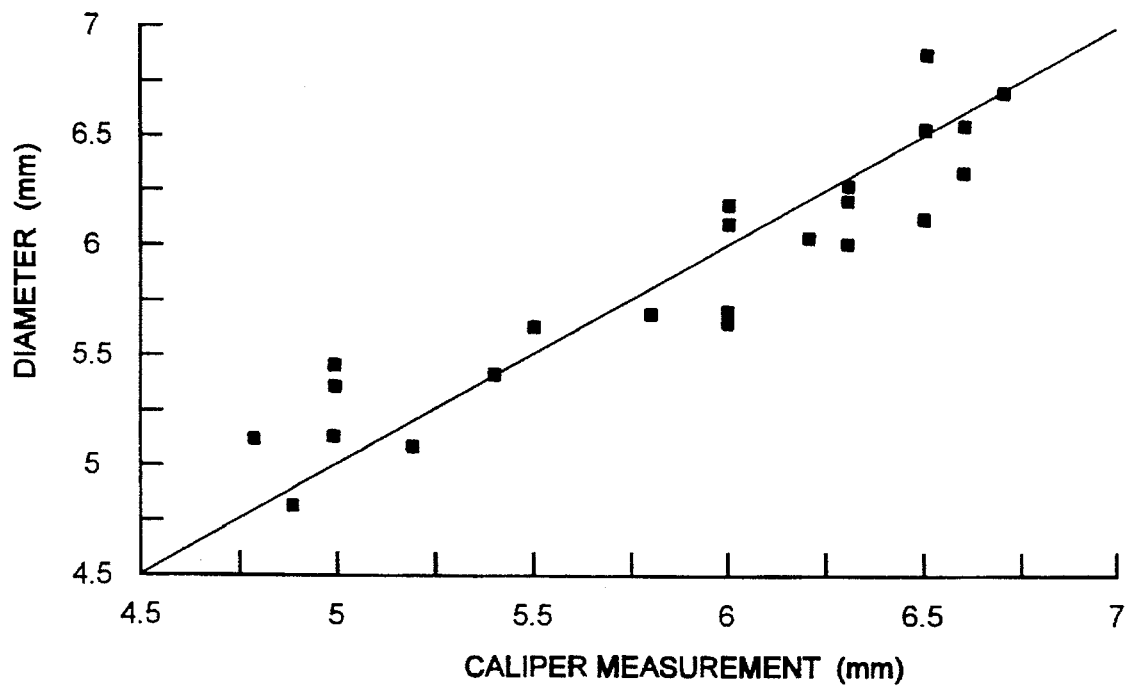

2. FIGS. 8A–8B illustrate measurements taken in the neck portion of crystal 35 in graphical form. FIG. 8A shows the diameter in millimeters as measured with calipers and the diameter in millimeters as measured by vision system 59 versus the length of the neck. As shown, fine-tuning may be necessary on the scaling (e.g., bias and gain) to minimize the error between the two measurements. Further, the curve showing the measurements determined by vision system 59 is based on a sampling rate of one sample per minute which might miss certain peaks and valleys of the neck diameter since the neck portion of crystal 35 grows as much as five millimeters in one minute. Improvements in scaling have yielded results with an accuracy of ±0.5 mm in the 4.5 mm to 7.0 mm range of diameters. FIG. 8B shows the diameter in millimeters as measured by vision system 59 versus the diameter in millimeters as measured with calipers.

Figure 9A:
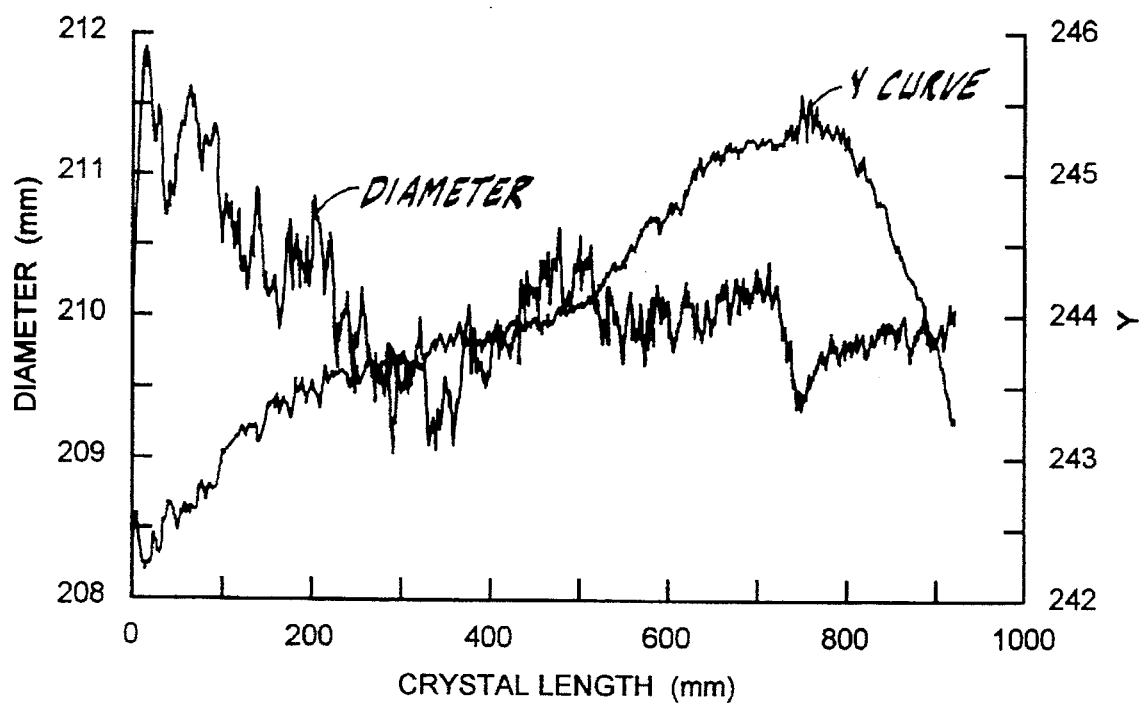
FIGS. 9A and 9B are graphical illustrations of exemplary crystal body measurements for the crystal growing apparatus and control system of FIG. 1.
Figure 9B:
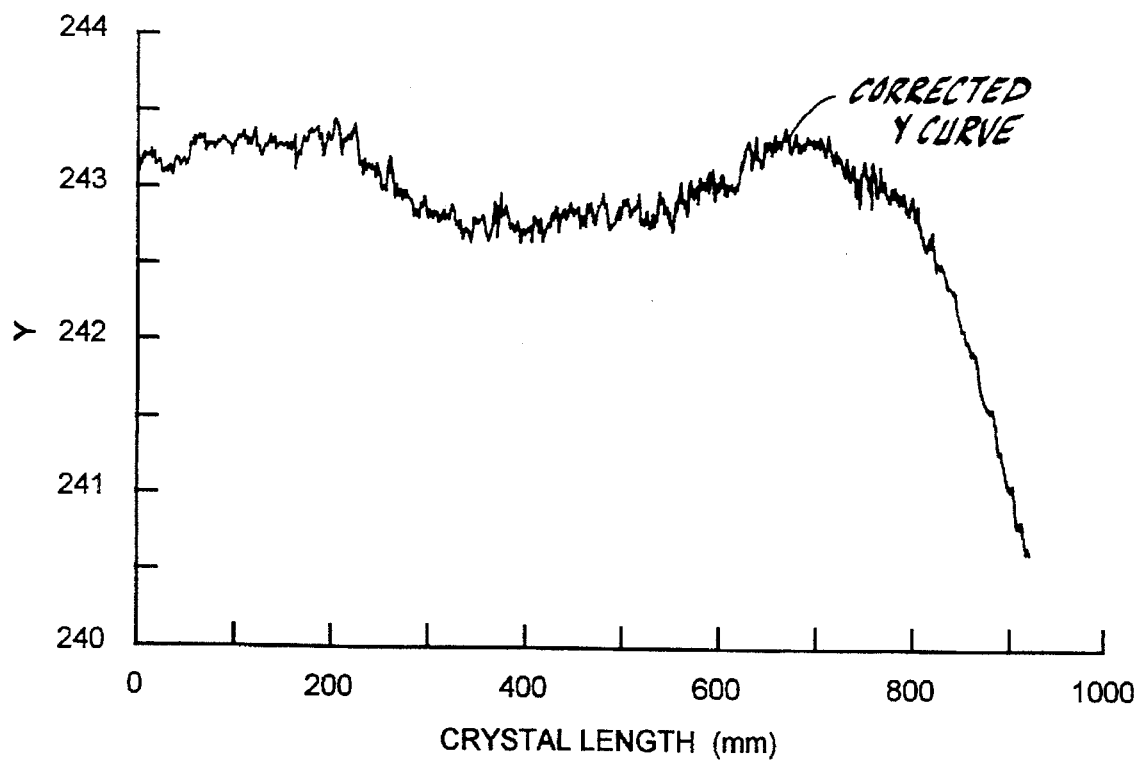

3. FIGS. 9A–9B illustrate measurements taken over the length of crystal 35 in graphical form. For purposes of FIGS. 9A–9B, crystal length is measured from a reference point on the body portion of crystal 35 where crystal 35 has a relatively uniform diameter and does not include the neck and crown portions of crystal 35. FIG. 9A shows the diameter in millimeters as measured by vision system 59 and the y coordinate of the center point C in corrected pixels versus the length of crystal 35. As described above, the y coordinate of the center point C is calculated by: y=1.2 ($y_{pixel}$) where y is in terms of corrected pixels. FIG. 9B shows the corrected y coordinate of center point C in corrected pixels versus the crystal length in millimeters. As described above, the value of the y coordinate interacts with the diameter of crystal 35 due to the perspective distortion caused by the angle at which camera 53 is mounted and the assumption of an elliptically-shaped bright ring. Although multiplying $y_{pixel}$ by a scaling factor of 1.2 partially compensates for this distortion, further correction is desirable. The further correction attempts to isolate the predicted drop in melt level 41 caused by the reduced diameter of crucible 27 as melt 33 is depleted to approximately 40 kg remaining. With the lift ratio of crucible 27 fixed, melt 33 tends to be depleted faster than crucible drive unit 31 raises crucible 27. In this instance, the corrected y coordinate is determined by: $y_{corrected} = y - C_1(\text{crystal length}) + C_2(\text{diameter D} - C_3)$ where $C_1 = 0.0033$, $C_2 = 0.35$ and $C_3 = 209$. In other words, the y coordinate of the center point C is adjusted by subtracting the long-term, apparently linear, increase in melt level 41 from 0 to approximately 750 mm in length and by adding a delta diameter multiplied by a scale factor.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method for use in combination with an apparatus for growing a silicon crystal from a silicon melt, said method for determining a diameter of the silicon crystal being pulled from the silicon melt, said silicon melt having a surface with a meniscus which is visible as a bright area adjacent the silicon crystal, said method comprising the steps of:

generating an image pattern of a portion of the bright area adjacent the silicon crystal with a camera;

detecting an optical characteristic of the image pattern;

defining edges in the image pattern as a function of the detected optical characteristic, said defined edges corresponding to an edge of the bright area;

defining a curve corresponding to the shape of the meniscus, said defined curve representing a circle that fits the defined edges in the image pattern corresponding to the edge of the bright area;

determining a dimension of the defined curve; and determining the diameter of the silicon crystal as a function of the determined dimension of the defined curve.

2. The method of claim 1 further comprising the step of defining window regions of the image pattern adjacent the portion of the bright area wherein the optical characteristic of the image pattern is detected within the window regions for defining the edges in the image pattern corresponding to the edge of the bright area.

3. The method of claim 2 wherein the optical characteristic of the image pattern is an intensity gradient and wherein the step of detecting an optical characteristic of the image pattern includes determining the intensity gradient of the image pattern within the window regions.

4. The method of claim 2 wherein the silicon crystal is generally cylindrical and the bright area is generally ring-shaped and wherein the step of defining the curve includes defining a circle that includes the edge of the ring-shaped bright area defined within at least three of the window regions of the image pattern.

5. The method of claim 4 further comprising the step of determining the center of the defined circle with respect to a reference x-y coordinate system wherein the y coordinate of the center is indicative of melt level.

6. The method of claim 5 wherein a crucible contains the silicon melt from which the silicon crystal is pulled and the crystal growing apparatus provides for relative movement between the silicon crystal and the crucible and further comprising the step of controlling the vertical position of the crucible as a function of the y coordinate of the center of the defined circle thereby to control the crystal growing apparatus.

7. The method of claim 1 further comprising the step of searching the image pattern for the portion of the bright area as a function of the intensity of the image pattern thereby to detect the bright area.

8. The method of claim 1 wherein a crucible contains the silicon melt from which the silicon crystal is pulled and the crystal growing apparatus provides for relative movement between the silicon crystal and the crucible and further comprising the steps of controlling the rates at which the crucible, the silicon crystal, or both, are rotated in response to the determined diameter of the silicon crystal thereby to control the crystal growing apparatus.

9. The method of claim 1 wherein aa crucible contains the silicon melt from which the silicon crystal is pulled and the crystal growing apparatus provides for relative movement between the silicon crystal and the crucible and further comprising the step of controlling the rate at which the silicon crystal is pulled from the silicon melt in response to the determined diameter of the silicon crystal thereby to control the crystal growing apparatus.

10. The method of claim 1 wherein a crucible contains the silicon melt from which the silicon crystal is pulled and the crystal growing apparatus provides for relative movement between the silicon crystal and the crucible and further comprising the step of controlling the temperature of the silicon melt in response to the determined diameter of the silicon crystal thereby to control the crystal growing apparatus.

11. A method for use in combination with an apparatus for growing a silicon crystal from a silicon melt, said method for determining a diameter of the silicon crystal being pulled from the silicon melt, said silicon melt having a surface with a meniscus which is visible as a bright area adjacent the silicon crystal, said method comprising the steps of:

generating an image pattern of a portion of the bright area adjacent the silicon crystal with a camera;

detecting an optical characteristic of the image pattern;

defining an edge of the bright area as a function of the detected optical characteristic;

defining window regions of the image pattern adjacent the portion of the bright area wherein the optical characteristic of the image pattern is detected within the window regions for defining the edge of the bright area;

moving the window regions as a function of the detected optical characteristic of the image pattern within the window regions in response to the bright area varying during pulling;

defining a curve including the defined edge of the bright area, said defined curve corresponding to the shape of the meniscus;

determining a dimension of the defined curve; and determining the diameter of the silicon crystal as a function of the determined dimension of the defined curve.

12. A method for use in combination with an apparatus for growing a silicon crystal from a silicon melt, said method for determining a diameter of the silicon crystal being pulled from the silicon melt, said silicon melt having a surface with a meniscus which is visible as a bright area adjacent the silicon crystal, said method comprising the steps of:

generating an image pattern of a portion of the bright area adjacent the silicon crystal with a camera;

detecting an optical characteristic of the image pattern;

defining an edge of the bright area as a function of the detected optical characteristic;

defining window regions of the image pattern adjacent the portion of the bright area wherein the optical characteristic of the image pattern is detected within the window regions for defining the edge of the bright area;

defining a center point on the image pattern, wherein the window regions are defined at preselected positions on the image pattern which are located radially with respect to the defined center point;

searching the image pattern for the portion of the bright area as a function of the intensity of the image pattern thereby to detect the bright area if the edge of the portion of the bright area is not defined within the window regions at the preselected positions;

defining a curve including the defined edge of the bright area, said defined curve corresponding to the shape of the meniscus;

determining a dimension of the defined curve; and determining the diameter of the silicon crystal as a function of the determined dimension of the defined curve.

13. A method for use in combination with an apparatus for growing a silicon crystal from a silicon melt, said method for determining a diameter of the silicon crystal being pulled from the silicon melt, said silicon melt having a surface with a meniscus which is visible as a bright area adjacent the silicon crystal, said crystal growth apparatus providing for rotation of the silicon crystal at a reference rate, said method comprising the steps of:

generating an image pattern of a portion of the bright area adjacent the silicon crystal with a camera;

detecting an optical characteristic of the image pattern;

defining an edge of the bright area as a function of the detected optical characteristic;

defining a curve including the defined edge of the bright area, said defined curve corresponding to the shape of the meniscus;

determining a dimension of the defined curve;

determining the diameter of the silicon crystal as function of the determined dimension of the defined curve; and detecting periodic deviations in the determined dimension of the defined curve relative to the reference rate thereby indicating zero dislocation growth of the silicon crystal.

14. A method for use in combination with an apparatus for growing a silicon crystal from a silicon melt, said method for determining a diameter of the silicon crystal being pulled from the silicon melt, said silicon melt having a surface with a meniscus which is visible as a bright area adjacent the silicon crystal, said silicon crystal being pulled from the silicon melt along a longitudinal axis which is substantially perpendicular to the silicon melt surface, said method comprising the steps of:

generating an image pattern of a portion of the bright area adjacent the silicon crystal with a camera, said camera having an optical axis which is at an acute angle with respect to the longitudinal axis;

compensating for distortion of the image pattern caused by the camera angle;

detecting an optical characteristic of the image pattern;

defining an edge of the bright area as a function of the detected optical characteristic;

defining a curve including the defined edge of the bright area, said defined curve corresponding to the shape of the meniscus;

determining a dimension of the defined curve; and determining the diameter of the silicon crystal as a function of the determined dimension of the defined curve.

15. A method for use in combination with an apparatus for growing a silicon crystal from a silicon melt, said method for determining a diameter of the silicon crystal being pulled from the silicon melt, said silicon melt having a surface with a meniscus which is visible as a bright area adjacent the silicon crystal, said silicon crystal being generally cylindrical and said bright area being generally ring-shaped, said method comprising the steps of:

generating an image pattern of a portion of the bright area adjacent the silicon crystal with a camera;

detecting an optical characteristic of the image pattern;

defining an edge of the bright area as a function of the detected optical characteristic;

defining window regions of the image pattern adjacent the portion of the bright area wherein the optical characteristic of the image pattern is detected within the window regions for defining the edge of the bright area;

defining an ellipse that includes the edge of the ring-shaped bright area defined within at least three of the window regions of the image pattern, said defined ellipse corresponding to the shape of the meniscus;

determining a dimension of the defined ellipse; and determining the diameter of the silicon crystal as a function of the determined dimension of the defined ellipse.

* * * * *